(12) United States Patent
Han et al.

(10) Patent No.: US 11,581,202 B2
(45) Date of Patent: Feb. 14, 2023

(54) SUBSTRATE DEBONDING APPARATUS

(71) Applicant: SAMSUNG ELECTRONICS CO., LTD., Suwon-si (KR)

(72) Inventors: Ilyoung Han, Uiwang-si (KR); Kyoungran Kim, Suwon-si (KR); Chulhyun Park, Anyang-si (KR); Minjae Shin, Osan-si (KR); Geunsik Oh, Suwon-si (KR); Hyunjin Lee, Hwaseong-si (KR); Soonwon Lee, Suwon-si (KR); Nungpyo Hong, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 328 days.

(21) Appl. No.: 17/078,190

(22) Filed: Oct. 23, 2020

(65) Prior Publication Data
US 2021/0358778 A1 Nov. 18, 2021

(30) Foreign Application Priority Data
May 15, 2020 (KR) .................. 10-2020-0058446

(51) Int. Cl.
*B32B 43/00* (2006.01)
*H01L 21/67* (2006.01)
(Continued)

(52) U.S. Cl.
CPC .. *H01L 21/67115* (2013.01); *H01L 21/67092* (2013.01); *H01L 21/6838* (2013.01);
(Continued)

(58) Field of Classification Search
CPC ............. B32B 43/006; Y10T 156/1158; Y10T 156/1917
See application file for complete search history.

(56) References Cited

U.S. PATENT DOCUMENTS 6,107,001 A 8/2000 Lewis et al.
7,153,130 B2 12/2006 Christoff
(Continued)

FOREIGN PATENT DOCUMENTS

JP H 0562950 A 3/1993
JP 2018-028001 A 2/2018

*Primary Examiner* — Philip C Tucker
*Assistant Examiner* — Nickolas R Harm
(74) *Attorney, Agent, or Firm* — Lee IP Law, P.C.

(57) ABSTRACT

A substrate debonding apparatus configured to separate a support substrate attached to a first surface of a device substrate by an adhesive layer, the substrate debonding apparatus including a substrate chuck configured to support a second surface of the device substrate, the second surface being opposite to the first surface of the device substrate; a light irradiator configured to irradiate light to an inside of the adhesive layer; and a mask between the substrate chuck and the light irradiator, the mask including an opening through which an upper portion of the support substrate is exposed, and a first cooling passage or a second cooling passage, the first cooling passage being configured to provide a path in which a coolant is flowable, the second cooling passage being configured to provide a path in which air is flowable and to provide part of the air to a central portion of the opening.

20 Claims, 14 Drawing Sheets

(51) Int. Cl.
*H01L 21/683* (2006.01)
*H01L 23/00* (2006.01)

(52) U.S. Cl.
CPC .......... *H01L 24/799* (2013.01); *B32B 43/006* (2013.01); *H01L 21/67248* (2013.01); *Y10T 156/1158* (2015.01); *Y10T 156/1917* (2015.01)

(56) References Cited

U.S. PATENT DOCUMENTS

| | | | |
|---|---|---|---|
| 7,384,811 B2* | 6/2008 | Miyamoto | H01L 21/67132 438/33 |
| 7,498,240 B2 | 3/2009 | Hiatt et al. | |
| 7,901,532 B2 | 3/2011 | Bain et al. | |
| 8,268,656 B2 | 9/2012 | Kajiyama | |
| 9,478,514 B2 | 10/2016 | Chang et al. | |
| 9,517,866 B2 | 12/2016 | Coffey et al. | |
| 9,761,477 B2 | 9/2017 | Chang et al. | |
| 9,786,612 B2 | 10/2017 | Yu et al. | |
| 10,312,144 B2 | 6/2019 | Koshimizu et al. | |
| 2005/0032332 A1* | 2/2005 | Miyamoto | H01L 21/6835 438/460 |
| 2008/0308231 A1* | 12/2008 | Lee | B32B 43/006 156/381 |
| 2011/0132549 A1* | 6/2011 | Sercel | B23K 26/40 156/753 |
| 2014/0102643 A1* | 4/2014 | Porneala | B32B 43/006 156/753 |
| 2015/0004400 A1* | 1/2015 | Lilleland | H01L 21/67017 428/447 |
| 2017/0133243 A1* | 5/2017 | Thallner | H01L 21/68714 |
| 2018/0366362 A1 | 12/2018 | Morikazu et al. | |
| 2019/0148207 A1 | 5/2019 | Chang et al. | |
| 2020/0079044 A1* | 3/2020 | Maheshwari | B32B 43/006 |
| 2021/0191018 A1* | 6/2021 | Wang | B32B 43/006 |

* cited by examiner

SUBSTRATE DEBONDING APPARATUS

CROSS-REFERENCE TO RELATED APPLICATION

Korean Patent Application No. 10-2020-0058446, filed on May 15, 2020, in the Korean Intellectual Property Office, and entitled: "Substrate Debonding Apparatus," is incorporated by reference herein in its entirety.

BACKGROUND

1. Field

Embodiments relates to a substrate debonding apparatus.

2. Description of the Related Art

As the demand for size and weight reduction of electronic components continues, a thickness of the device substrate may be decreased. To easily handle the device substrate, the support substrate may be attached to a surface of the device substrate. For example, the support substrate may be attached to a surface of the device substrate by an adhesive layer.

In a process of separating the support substrate from the device substrate, light may be irradiated onto the adhesive layer. Light, which is irradiated to the inside of the adhesive layer, may decrease adhesion between the device substrate and the support substrate.

SUMMARY

The embodiments may be realized by providing a substrate debonding apparatus configured to separate a support substrate attached to a first surface of a device substrate by an adhesive layer, the substrate debonding apparatus including a substrate chuck configured to support a second surface of the device substrate, the second surface being opposite to the first surface of the device substrate; a light irradiator configured to irradiate light to an inside of the adhesive layer; and a mask between the substrate chuck and the light irradiator, the mask including an opening through which an upper portion of the support substrate is exposed, and a first cooling passage or a second cooling passage, the first cooling passage being configured to provide a path in which a coolant is flowable, the second cooling passage being configured to provide a path in which air is flowable and to provide part of the air to a center of the opening.

The embodiments may be realized by providing a substrate debonding apparatus configured to separate a support substrate attached to a first surface of a device substrate by an adhesive layer, the substrate debonding apparatus including a substrate chuck configured to support a second surface of the device substrate, the second surface being opposite to the first surface of the device substrate; a light irradiator configured to irradiate light to an inside of the adhesive layer; a mask between the substrate chuck and the light irradiator and including an opening through which an upper portion of the support substrate is exposed; and a mask driver configured to move the mask in a horizontal direction or a vertical direction.

The embodiments may be realized by providing a substrate debonding apparatus configured to separate a support substrate attached to a first surface of a device substrate by an adhesive layer, the substrate debonding apparatus including a substrate chuck configured to support the device substrate and including a chuck cooling passage in which first coolant for cooling the device substrate is flowable; a light irradiator configured to irradiate light to and inside of the adhesive layer; and a mask between the substrate chuck and the light irradiator and including an opening through which an upper portion of the support substrate is exposed, and a first cooling passage or a second cooling passage, the first cooling passage being configured to provide a path in which a second coolant is flowable, and the second cooling passage being configured to provide a path in which air is flowable and to provide part of the air to a central portion of the opening.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
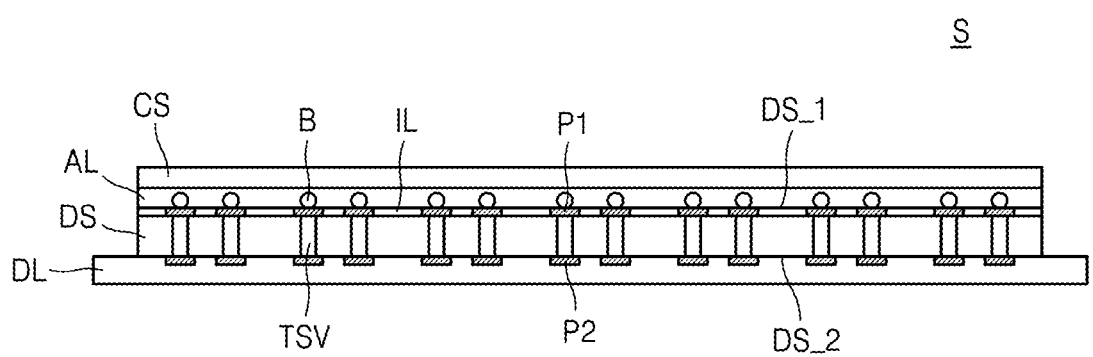
FIG. 1 is a cross-sectional view of a subject processed by a substrate debonding apparatus, according to an example embodiment.

FIG. 1 is a cross-sectional view of a subject S processable by a substrate debonding apparatus 10 (of FIG. 2), according to an example embodiment. The subject S may be mounted on a substrate chuck 110 of the substrate debonding apparatus 10 of FIG. 2.

Referring to FIG. 1, the subject S may include a device substrate DS, an adhesive layer AL, a support substrate CS, a dicing layer DL, and the like. The device substrate DS may have a first surface DS_1 and a second surface DS_2 (facing or opposite to the first surface DS_1). In an implementation, the first surface DS_1 may be an upper surface of the device substrate DS, and the second surface DS_2 may be a lower surface thereof.

In an implementation, the device substrate DS may be a wafer on which semiconductor devices are formed. In an implementation, the device substrate DS may include a printed circuit board (PCB).

As the demand for size and weight reduction of electronic components continues, a thickness of the device substrate DS may be less than or equal to about 50 μm. To easily handle the device substrate DS and reduce physical damage thereto, the support substrate CS may be adhered to the first surface DS_1 of the device substrate DS by the adhesive layer AL.

The adhesive layer AL may include an adhesive material to attach the device substrate DS and the support substrate CS to each other. The adhesive layer AL may be a film or tape that is adhesive. In an implementation, the adhesive layer AL may be a dual-adhesive film or dual-adhesive tape.

In an implementation, the adhesive layer AL may include a material causing a chemical reaction by or in response to light. For example, the adhesive layer AL may include a material discharged because of ultraviolet rays. In an implementation, when ultraviolet rays are irradiated onto the adhesive layer AL, expandable protrusions may be generated inside the adhesive layer AL and may decrease adhesion between the device substrate DS and the support substrate CS.

The support substrate CS may be a substrate attached to the first surface DS_1 of the device substrate DS. The support substrate CS may be attached to the first surface DS_1 of the device substrate DS to easily handle the device substrate DS and reduce physical damage to the device substrate DS.

In an implementation, the support substrate CS may include a material through which the light may penetrate. In an implementation, the support substrate CS may be a carrier substrate including glass through which ultraviolet rays pass.

In an implementation, an upper surface of the support substrate CS may have substantially the same size (e.g., shape and area) as that of the first surface DS_1 of the device substrate DS. In an implementation, side surfaces of the support substrate CS and the device substrate DS may be aligned and may be on substantially the same plane.

Figure 2:
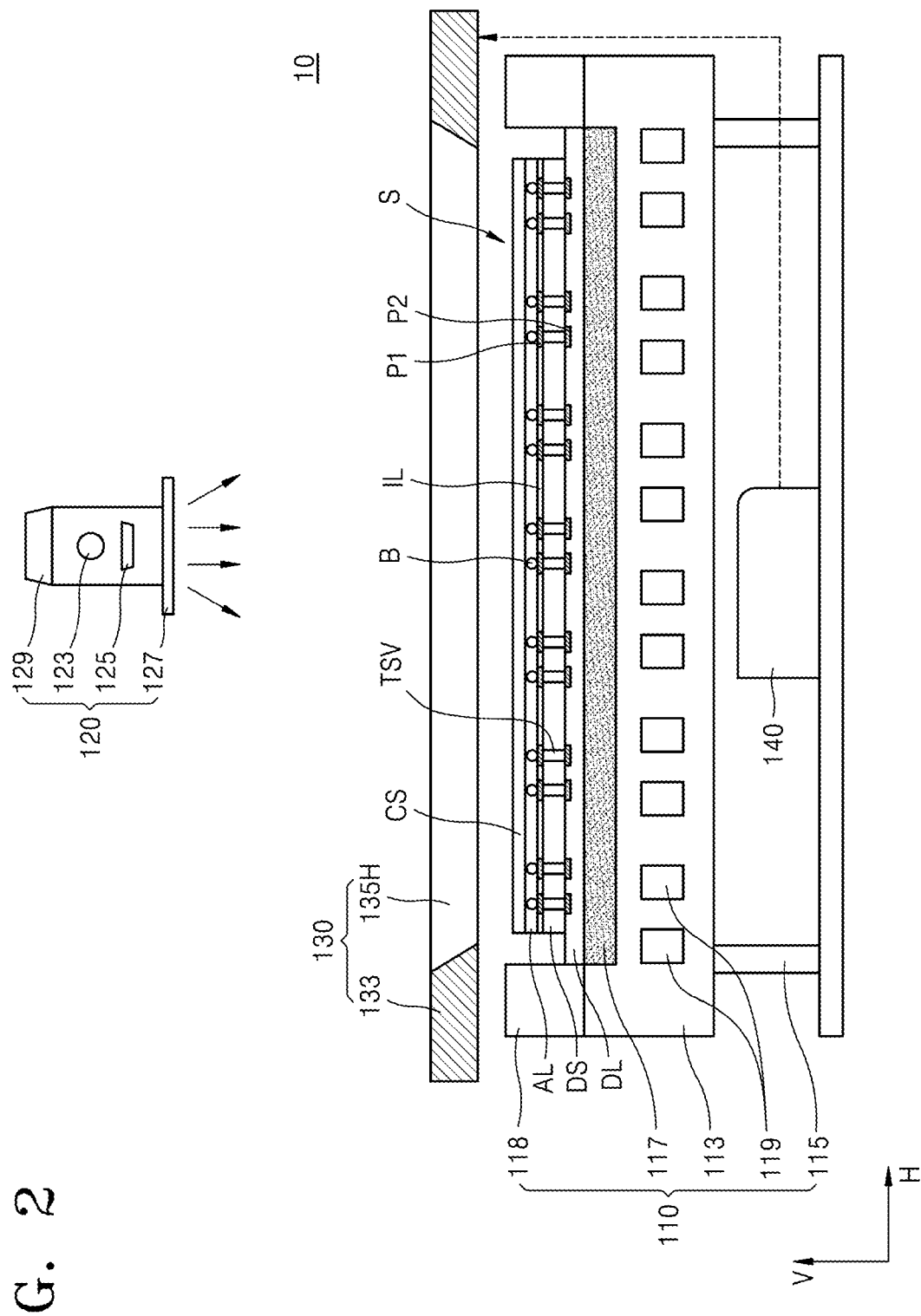
FIG. 2 is a cross-sectional view of a substrate debonding apparatus according to an example embodiment.

In an implementation, the support substrate CS may be separated from the device substrate DS by the substrate debonding apparatus 10 of FIG. 2. In an implementation, to separate the device substrate DS from the support substrate CS, the substrate debonding apparatus 10 may irradiate, to the inside of the adhesive layer AL, light (e.g., ultraviolet rays) having a sufficient amount of energy, and may decrease adhesion between the device substrate DS and the support substrate CS.

When the light having the sufficient amount of energy is irradiated onto or into the adhesive layer AL, the device substrate DS may be easily separated from the support substrate CS, and the device substrate DS and the dicing layer DL could be damaged by heat energy of the light. In an implementation, heat energy transmitted to the device substrate DS and the dicing layer DL may be decreased while the light having the sufficient amount of energy is irradiated onto the adhesive layer AL.

The dicing layer DL may be attached to the second surface DS_2 of the device substrate DS. The dicing layer DL may support the device substrate DS while the support substrate CS is separated from the device substrate DS. Also, in an individualization process of the device substrate DS, the dicing layer DL may extend, and the device substrate DS may be individualized.

In an implementation, an area of an upper surface of the dicing layer DL may be greater than that of the second surface DS_2 of the device substrate DS. In an implementation, when the subject S is viewed on a plan view, a portion of edges of the dicing layer DL may not be covered by the device substrate DS, and may be exposed.

In an implementation, the device substrate DS may further include a through electrode TSV, an insulating layer IL, a bump B, a first pad P1, and a second pad P2. The through electrode TSV may penetrate a portion of the device substrate DS in a vertical direction V and may be electrically connected to semiconductor devices formed on the device substrate DS.

In an implementation, the first pad P1 may be on the first surface DS_1 of the device substrate DS and may contact an upper surface of the through electrode TSV. Side surfaces of the first pad P1 may be surrounded by the insulating layer IL.

In an implementation, the second pad P2 may be on the second surface DS_2 of the device substrate DS and may contact a lower surface of the through electrode TSV. Side surfaces of the second pad P2 may be surrounded by the dicing layer DL.

In an implementation, the bump B may be on the first pad P1 and may include a conductive material electrically connected to the through electrode TSV. In an implementation, the bump B may electrically connect semiconductor device layers of the device substrate DS to external devices. The bump B may be exposed through the insulating layer IL, and outer surfaces of the bump B may be surrounded by the adhesive layer AL.

FIG. 2 is a cross-sectional view of the substrate debonding apparatus 10 according to an example embodiment The substrate debonding apparatus 10 according to an example embodiment may separate the support substrate CS, which is attached to the first surface DS_1 of the device substrate DS of FIG. 1, from the device substrate DS.

In an implementation, the substrate debonding apparatus 10 may irradiate light (e.g., ultraviolet rays) onto the adhesive layer AL between the device substrate DS and the support substrate CS, and may decrease adhesion between the support substrate CS and the device substrate DS.

Referring to FIG. 2, the substrate debonding apparatus 10 may include the substrate chuck 110, a light irradiation device or light irradiator 120, a mask 130, and a mask driver 140. The substrate chuck 110 may support the subject S. In an implementation, the substrate chuck 110 may provide a suction force to a lower portion of the subject S and thus may support the subject S (e.g., may hold the subject S using a vacuum).

The substrate chuck 110 may include a chuck table 113, a chuck frame 115 (supporting the chuck table 113), a chuck plate 117, and a chuck cooling passage 119.

In an implementation, the chuck plate 117 may be a plate providing the suction force to the lower portion of the subject S of FIG. 1 and contacting the lower portion of the subject S. In an implementation, the chuck plate 117 may be a plate providing a suction force to the dicing layer DL of FIG. 1 and contacting the dicing layer DL.

The chuck plate 117 may be on the chuck table 113, and side surfaces of the chuck plate 117 may be surrounded by the chuck table 113. In an implementation, the chuck plate 117 may have a shape corresponding to that of the subject S. In an implementation, when a shape of the subject S is a disk, the shape of the chuck plate 117 may also be a disk.

In an implementation, the chuck plate 117 may be connected to a suction device and may transmit a suction force, which is provided by the suction device, to the lower portion of the subject S.

In an implementation, to evenly distribute the suction force, which is provided by the suction device, to a lower surface of the subject S, the chuck plate 117 may have a porous structure including pores.

In an implementation, the chuck plate 117 may include porous ceramic. In an implementation, the chuck plate 117 may be formed through plastic hardening of high-density ceramic. Accordingly, the chuck plate 117 may have the porous structure including pores.

In an implementation, the chuck plate 117 may include, e.g., silicon carbide (SiC), silicon nitride ($Si_3N_4$), or alumina ($Al_2O_3$) which include pores. As used herein, the term "or" is not an exclusive term, e.g., "A or B" would include A, B, or A and B.

A ratio of a volume of the pores to a volume of the chuck plate 117 may be defined as porosity. The porosity of the chuck plate 117 may be adjusted according to a magnitude of the suction force applied to the subject S. In an implementation, the porosity of the chuck plate 117 may be, e.g., about 5% to about 40%.

Some chuck plates may include vacuum holes, through which the suction force is provided to an upper portion of the subject S, and grooves connected to the vacuum holes. Some chuck plates may not evenly provide the suction force to the lower portion of the subject S, and the subject S may be physically damaged.

In an implementation, the chuck plate 117 may have the porous structure including pores, and the chuck plate 117 may evenly provide the suction force to the lower portion of the subject S and prevent physical damage to the subject S.

The chuck cooling passage 119 may be inside the chuck table 113, and a coolant (e.g., cooling fluid) for cooling the subject S may flow in the chuck cooling passage 119. In an implementation, the coolant may include, e.g., water, ethylene glycol, silicon oil, or other suitable materials for cooling the subject S.

In an implementation, a shape of the chuck cooling passage 119 may be similar to a concentric circle inside the chuck table 113. In an implementation, the chuck cooling passage 119 may be connected to a temperature adjuster, and a temperature of the coolant flowing in the chuck cooling passage 119 may be adjusted by the temperature adjuster.

In an implementation, the substrate chuck 110 may further include a ring frame 118 on or at an edge of the chuck plate 117. In an implementation, the ring frame 118 may surround the side surfaces of the device substrate DS. In an implementation, the ring frame 118 may adhere to the dicing layer DL. In an implementation, the upper surface of the dicing layer DL may adhere to a lower surface of the ring frame 118.

In an implementation, inner side surfaces of the ring frame 118 may be spaced apart from the side surfaces of the device substrate DS. When the substrate debonding apparatus 10 is viewed on a plan view, the dicing layer DL may be viewed between the inner side surfaces of the ring frame 118 and the side surfaces of the device substrate DS.

In an implementation, the ring frame 118 may be moved in a direction perpendicular to a direction in which the chuck plate 117 extends (e.g., the vertical direction V parallel to a direction of gravity). As described above, because the dicing layer DL may be attached to a lower portion of the ring frame 118, the subject S may also be moved in the vertical direction V according to a movement of the ring frame 118 in the vertical direction V.

The light irradiator 120 may be on the substrate chuck 110 and may irradiate light onto the subject S on the substrate chuck 110. In an implementation, the light irradiator 120 may irradiate light (e.g., ultraviolet rays) to the inside of the adhesive layer AL to decrease the adhesion between the device substrate DS and the support substrate CS.

In an implementation, when the light irradiator 120 irradiates the light (e.g., ultraviolet rays) to the inside of the adhesive layer AL, a chemical reaction for generating expandable protrusions may occur inside the adhesive layer AL. The expandable protrusions in the adhesive layer AL may weaken the adhesion between the device substrate DS and the support substrate CS. In an implementation, the expandable protrusions may apply external power or pressure to the support substrate CS in a direction further from the device substrate DS.

In an implementation, the light irradiator 120 may include a light source 123, a light movement module 125, a light filter 127, a cooling module 129, and the like. In an implementation, the light movement module 125 may move light generated by the light source 123. In an implementation, the light movement module 125 may include a combination of a mirror, which reflects light, and lenses passing and refracting the light.

In an implementation, the light filter 127 may pass or transmit light having a wavelength in a certain range, and may block light having a wavelength in another range. As described above, in the adhesive layer AL, a chemical reaction for generating the expandable protrusions may occur due to the ultraviolet rays. Accordingly, the light filter 127 may include a filter that transmits light having a wavelength of ultraviolet rays, and blocks light having a different wavelength (e.g., visible rays and infrared rays).

As described above, the light filter 127 according to an example embodiment may transmit light having a wavelength of ultraviolet rays, and may block light having a different wavelength. Accordingly, the light irradiator 120 according to an example embodiment may help reduce the heat energy of the light transmitted to the device substrate DS and the dicing layer DL. In an implementation, the light irradiator 120 may intensively irradiate (e.g., only) the ultraviolet rays to the inside of the adhesive layer AL for separation of the device substrate DS from the dicing layer DL while reducing damage to the device substrate DS and the dicing layer DL caused the heat energy of the (e.g., other wavelengths of) light.

The cooling module 129 may cool the light irradiator 120. In an implementation, the cooling module 129 may cool the light source 123, the light movement module 125, the light filter 127, and the like.

In an implementation, the cooling module 129 may include a combination of a cooling fan and a motor for driving the cooling fan. The cooling module 129 may cool the light irradiator 120 through air inhalation and exhaustion of the cooling fan (e.g., convective cooling).

The mask 130 may be between the substrate chuck 110 and the light irradiator 120 and may mask edges of the support substrate CS of the subject S. In an implementation, the mask 130 may prevent the light, which is irradiated from the light irradiator 120, from scattering to a periphery of the support substrate CS. Accordingly, the light may pass through the support substrate CS and may be intensively irradiated to the inside of the adhesive layer AL.

The mask 130 may include a mask plate 133 and an opening 135H. The mask plate 133 may mask edges of the support substrate CS. In an implementation, when the mask 130 is viewed on a plan view, a shape of the mask plate 133 may be a ring surrounding the edges of the support substrate CS.

In an implementation, the mask plate 133 may mask (e.g., may overlie) a portion of the dicing layer DL that is exposed through or at the side surfaces of the device substrate DS. In an implementation, when the mask 130 is viewed in plan view, the mask plate 133 may vertically overlap, in the vertical direction V, the portion of the dicing layer DL that is exposed through or at the side surfaces of the device substrate DS. In an implementation, when the mask 130 is viewed in plan view, the dicing layer DL may be covered by the mask plate 133.

In an implementation, the mask plate 133 may include a material that prevents the penetration of ultraviolet rays. In an implementation, the mask plate 133 may include a material that has a small coefficient of thermal expansion (CTE) and good corrosion resistance. In an implementation, the mask plate 133 may include invar, e.g., an alloy of iron (Fe) and nickel (Ni).

The opening 135H may be in a central portion of the mask 130. In an implementation, the opening 135H may vertically penetrate the central portion of the mask 130. When the mask 133 is viewed in plan view, the opening 135H may expose the support substrate CS of the subject S, and may not expose the dicing layer DL of the subject S. In an implementation, a shape of the opening 135H may be a circle that has substantially the same area as the upper surface of the support substrate CS.

In an implementation, as described below, the mask 130 may include a first cooling passage (330 of FIG. 6) or a second cooling passage (340 of FIG. 6) inside the mask 130. The first cooling passage 330 may provide a path in which the coolant flows inside the mask plate 133. In an implementation, the mask plate 133 may include the first cooling passage 330 in which the coolant flows, and the mask plate 133 may not be changed (e.g., damaged) by the heat energy of the heat irradiated from the light irradiator 120.

The second cooling passage 340 may be a path in which air flows inside the mask plate 133, and part of the air may be provided to the central portion of the opening 135H. In an implementation, the mask plate 133 may include the second cooling passage 340, and the subject S in or aligned with the opening 135H may be cooled.

The structure of the mask 130 will be described in more detail below with reference to FIGS. 3 to 10.

The mask driver 140 may move the mask 130 in a horizontal direction H and the vertical direction V. For example, the mask driver 140 may be an actuator that is a combination of a motor and gears that move the mask 130.

In an implementation, the mask driver 140 may move the mask 130 in the horizontal direction H or the vertical direction V to align the mask 130 with the subject S. In an implementation, the mask driver 140 may move the mask 130 in the horizontal direction H to make the mask plate 133 overlap the dicing layer DL, which is exposed through the side surfaces of the device substrate DS, in the vertical direction V, and make the opening 135H of the mask 130 overlap the upper surface of the support substrate CS in the vertical direction V.

In an implementation, the mask driver 140 may move the mask 130 in the vertical direction V (e.g., the direction of gravity) to make the mask 130 contact the temperature sensor (210 of FIG. 3) attached to the outside of the chuck table 113 described below. In an implementation, the mask driver 140 may move the mask 130 in the vertical direction V (e.g., a direction opposite to gravity) to separate the temperature sensor 210 from the mask 130.

In an implementation, the substrate debonding apparatus 10 may include the mask 130 and the light irradiator 120 including the light filter 127, and the substrate debonding apparatus 10 may easily separate the support substrate CS from the device substrate DS while decreasing damage to the device substrate DS and the dicing layer DL because of the heat energy of the light.

In an implementation, the substrate debonding apparatus 10 according to an example embodiment may include the substrate chuck 110 and the mask 130 that have cooling functions, and the substrate debonding apparatus 10 may quickly cool the mask 130 and the subject S while the support substrate CS is separated from the device substrate DS. Therefore, the speed of separating the support substrate CS from the device substrate DS may be improved.

Figure 3:
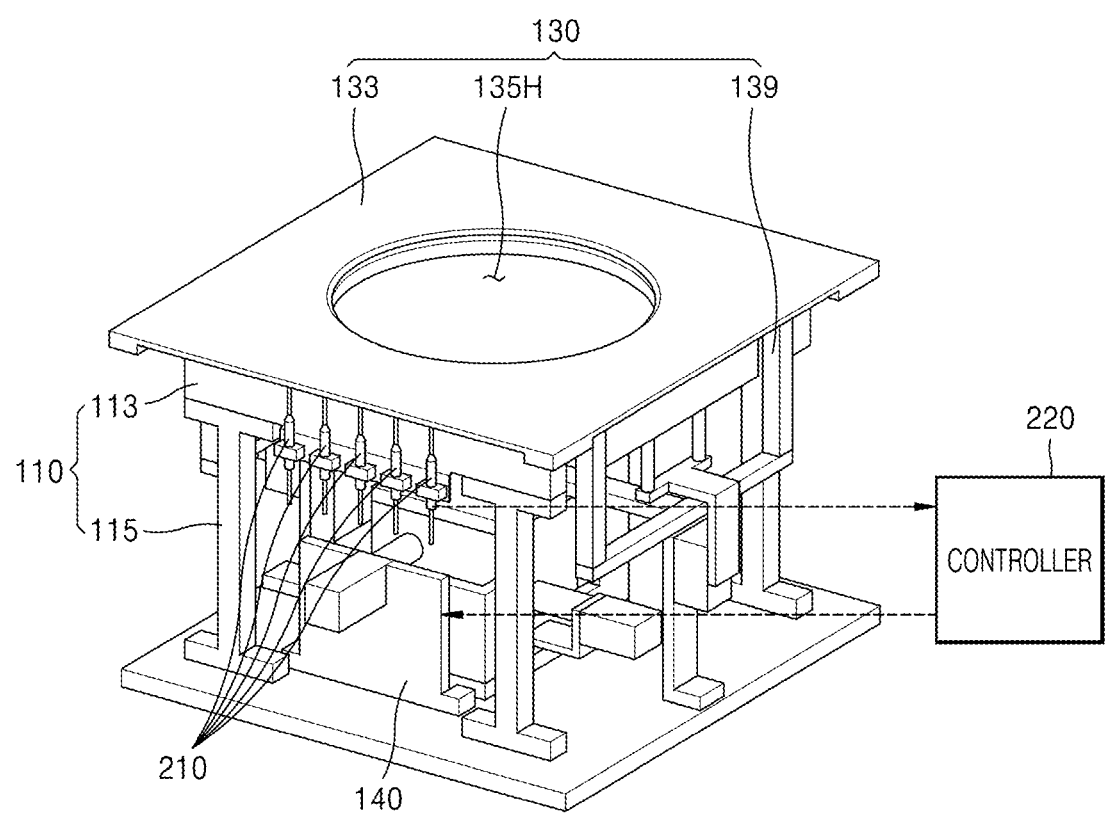
FIG. 3 is a perspective view of a substrate chuck and a mask, according to an example embodiment.
Figure 4:
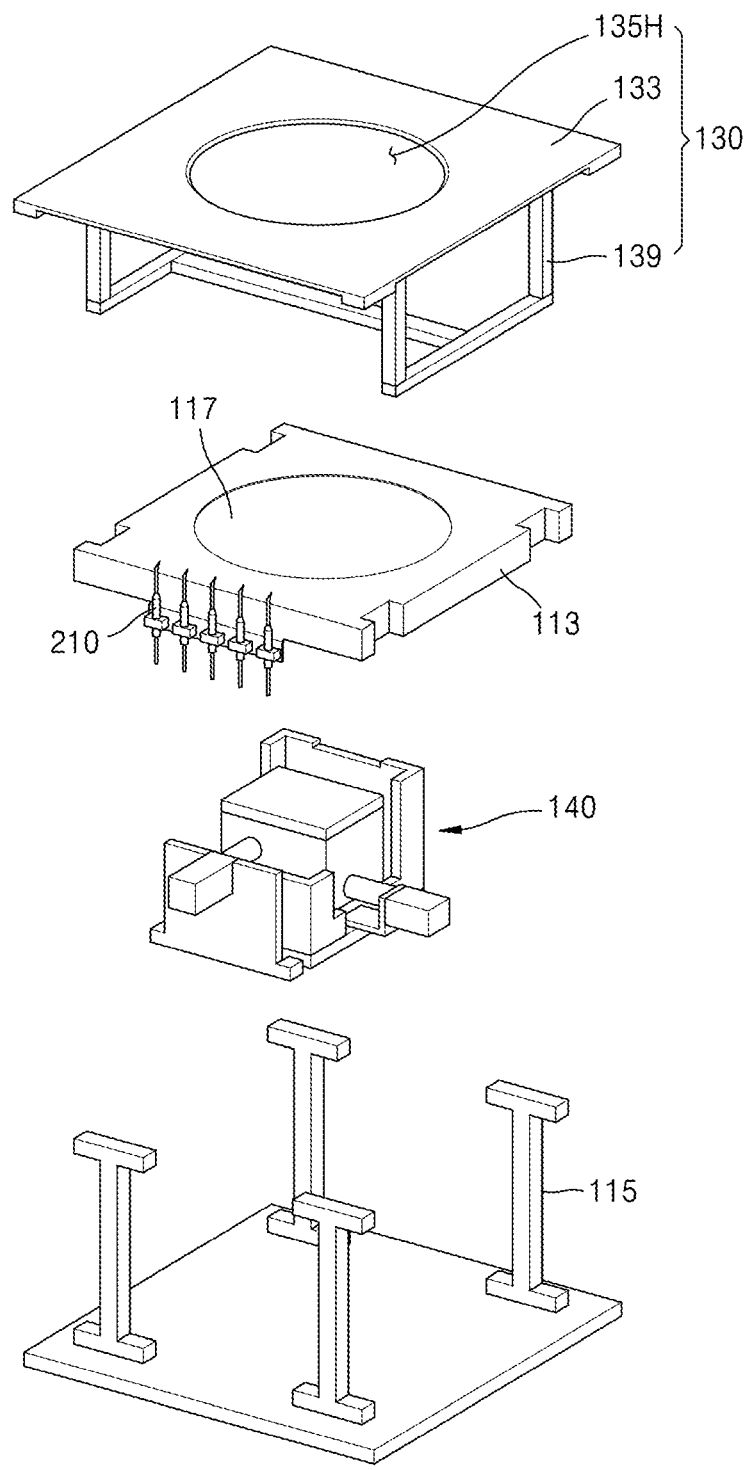
FIG. 4 is an exploded perspective view of a substrate chuck and a mask, according to an example embodiment.
Figure 5:
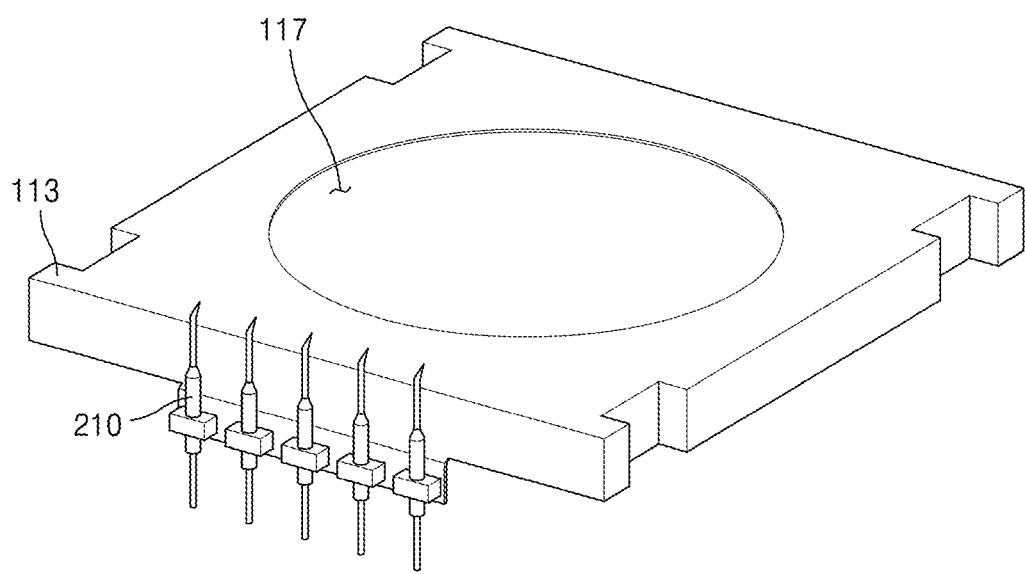
FIG. 5 is an enlarged view of a part of a substrate debonding apparatus, according to an example embodiment.

FIG. 3 is a perspective view of the substrate chuck 110 and the mask 130, according to an example embodiment. FIG. 4 is an exploded perspective view of the substrate chuck 110 and the mask 130, according to an example embodiment. FIG. 5 is an enlarged view of a portion of the substrate debonding apparatus 10, according to an example embodiment.

Referring to FIGS. 3 to 5, the substrate chuck 110 may include the chuck table 113 and the chuck frame 115. The chuck plate 117 may be on the chuck table 113, and an upper surface of the chuck plate 117 may be exposed. The chuck cooling passage 119 may be inside the chuck table 113 and under the chuck plate 117.

In an implementation, the mask driver 140 may be on a bottom surface of the chuck frame 115 and under the chuck table 113. The mask driver 140 may be connected to the mask 130 and may move the mask 130 in the horizontal direction H and the vertical direction V.

In an implementation, the mask 130 may further include a connection member or connector 139 that extends downwardly (e.g., in the vertical direction V) from the bottom of the mask plate 133 and surrounds part of the side and lower surfaces of the chuck table 113. In an implementation, the connector 139 may be a frame connecting the mask plate 133 to the mask driver 140. The connector 139 of the mask 130 may be connected to the mask driver 140 from a lower portion of the chuck table 113.

The substrate debonding apparatus 10 may further include the temperature sensors 210 that are coupled to the substrate chuck 110 and that measure a temperature of the mask 130. In an implementation, the temperature sensors 210 may be connected to the side surface of the chuck table 113 of the substrate chuck 110.

In an implementation, the temperature sensors 210 may measure the temperature of the mask 130 as the temperature sensors 210 contact the mask 130. In an implementation, according to an electromotive force generated on a region where the temperature sensors 210 contact the mask 130, the temperature sensors 210 may measure the temperature of the mask 130.

In an implementation, the temperature sensors 210 may extend (e.g., lengthwise) in the vertical direction V (e.g., a direction parallel to the direction of gravity). In an implementation, the temperature sensors 210 may each be a sensor of a pogo pin extending in the vertical direction V.

In an implementation, the temperature sensors 210 may be coupled to the side surfaces of the chuck table 113, and upper surfaces of the temperature sensors 210 may be at a higher level than an upper surface of the chuck table 113. Accordingly, as the chuck table 113 is moved in the vertical direction, the temperature sensors 210 may contact the mask 130 or may be separated therefrom.

Some other temperature sensors may be attached to a mask and may directly measure a temperature of the mask. When the mask is heated at a high temperature, some temperature sensors may be damaged by the heat. Also, when the mask is movable, some temperature sensors may include additional devices, e.g., cables, for connection between the temperature sensors and a controller. Such additional devices may restrict a movement of the mask.

The temperature sensors 210 according to an example embodiment may be coupled to the substrate chuck 110 and may contact the mask 130 according to a movement of the chuck table 113 in the vertical direction V. In an implementation, the temperature sensors 210 according to an example embodiment may not be damaged by heat of the mask 130. In an implementation, if the temperature sensors 210 were to be heated at a high temperature because of the heat of the mask 130, the mask driver 140 may move the mask 130 in the vertical direction V and separate the mask 130 and the temperature sensors 210 from each other. In an implementation, the temperature sensors 210 according to an example embodiment may be coupled to the substrate chuck 110, and the movement of the mask 130 may not be restricted.

The substrate debonding apparatus 10 may include a controller 220 that controls all operations of the substrate debonding apparatus 10. In an implementation, the controller 220 may be electrically connected to the mask driver 140 and the temperature sensors 210.

In an implementation, the controller 220 may be realized as hardware, firmware, software, or any combination thereof. In an implementation, the controller 220 may be a computing device such as a workstation computer, a desktop computer, a laptop computer, or a tablet computer. In an implementation, the controller 220 may be a simple controller, a microprocessor, a complicated processor such as a central processing unit (CPU) or a graphics processing unit (GPU), a processor implemented by software, exclusive hardware, or firmware. The controller 220 may be realized by, e.g., a general-purpose computer or application-specific hardware such as a Digital Signal Processor (DSP), a Field Programmable Gate Array (FPGA), or an Application Specific Integrated Circuit (ASIC).

In an implementation, the operation of the controller 220 may be embodied as commands stored in a computer-readable recording medium executable by at least one processor. In an implementation, the computer-readable recording medium may include a suitable mechanism for storing and/or transmitting information in a form readable by a machine (e.g., a computing device).

To align the mask 130 with the substrate chuck 110, the controller 220 may control the mask driver 140 to move the mask 130 in the horizontal direction H and the vertical direction V.

In an implementation, the controller 220 may control the mask driver 140 to move the mask 130 in the horizontal direction H when the mask plate 133 of the mask 130 overlaps the dicing layer DL, which is exposed through the side surface of the device substrate DS, in the vertical direction V, and when the opening 135H of the mask 130 overlaps the upper surface of the support substrate CS in the vertical direction V.

The controller 220 may control the mask driver 140 to move the mask 130 in the vertical direction V, and the temperature of the mask 130 may be measured. In an implementation, the controller 220 may control the mask driver 140 to move the mask 130 in the direction of gravity (e.g., the vertical direction V) to make the mask 130 contact the temperature sensors 210. In an implementation, the controller 220 may control the mask driver 140 to move the mask 130 in a direction opposite to the direction of gravity (e.g., the vertical direction V) to separate the mask 130 from the temperature sensors 210.

The controller 220 may control the substrate debonding apparatus 10 according to the temperature of the mask 130 that is received from the temperature sensors 210. In an implementation, when the controller 220 determines that the temperature of the mask 130 exceeds a reference temperature, the controller 220 may stop all operations of the substrate debonding apparatus 10.

In an implementation, when the controller 220 determines that the temperature of the mask 130 is greater than the reference temperature, the controller 220 may adjust a temperature, a discharge, a speed, or the like of the coolant flowing in the mask 130. In an implementation, when the controller 220 determines that the temperature of the mask 130 is greater than the reference temperature, the controller 220 may lower the temperature of the coolant flowing in the mask 130 and may increase the discharge and the speed of the coolant.

Hereinafter, the mask 130 according to an example embodiment will be described in more detail with reference to FIGS. 6 to 10.

Figure 6:
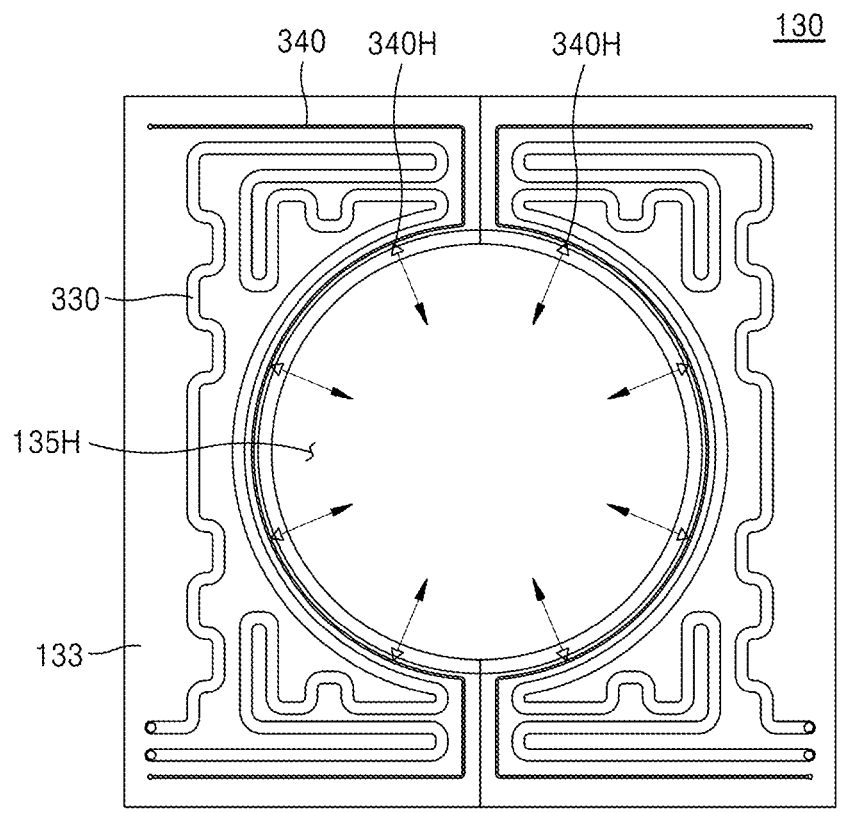
FIG. 6 is an internal cross-sectional view of a mask according to an example embodiment.

FIG. 6 is an internal cross-sectional view of the mask 130 according to an example embodiment. The mask 130 according to an example embodiment may include the mask plate 133 and the opening 135H. As described above, the mask plate 133 may be a plate to mask the periphery of the support substrate CS, and the opening 135H may be a hole through which the upper surface of the support substrate CS is exposed.

Referring to FIG. 6, the mask plate 133 of the mask 130 may include the first cooling passage 330 therein. In an implementation, the first cooling passage 330 may be a passage in which the coolant flows inside the mask plate 133. In an implementation, the first cooling passage 330 may be curved inside the mask plate 133 to cool a great area of the mask plate 133.

The coolant flowing in the first cooling passage 330 may decrease the temperature of the mask plate 133 while or as the support substrate CS is separated from the device substrate DS. In an implementation, the coolant flowing in the first cooling passage 330 may include, e.g., water, ethylene glycol, silicon oil, or other materials for cooling the mask plate 133. In an implementation, the discharge, the temperature, the speed, and the like of the coolant may be controlled by the controller 220.

In an implementation, the mask plate 133 of the mask 130 may include the second cooling passage 340 therein. The second cooling passage 340 may provide a path in which air flows inside the mask plate 133. A discharge, a temperature, a speed, and the like of air in the second cooling passage 340 may be controlled by the controller 220.

In an implementation, the second cooling passage 340 may be at a location adjacent to the inner side surface of the mask plate 133 and may surround the opening 135H. Also, the second cooling passage 340 may be formed inside the mask plate 133 and may include an air exhaust hole 340H that is open towards the central portion of the opening 135H. The air exhaust hole 340H may be provided in plural.

In an implementation, the air flowing in the second cooling passage 340 may be at least partially provided to the central portion of the opening 135H through the air exhaust hole 340H. The air emitted through the air exhaust hole 340H of the second cooling passage 340 may be provided to the subject S in or exposed by the opening 135H, and the emitted air may cool the subject S in or during the operation of separating the support substrate CS from the device substrate DS.

In an implementation, the mask plate 133 may include both the first cooling passage 330 and the second cooling passage 340. In an implementation, the mask plate 133 may only include one of the first cooling passage 330 or the second cooling passage 340.

The substrate debonding apparatus 10 according to an example embodiment may include at least one of the first cooling passage 330 and the second cooling passage 340. Accordingly, the substrate debonding apparatus 10 may help decrease deformation of and damage to the mask plate 133 because of the heat energy of the light.

Figure 7:
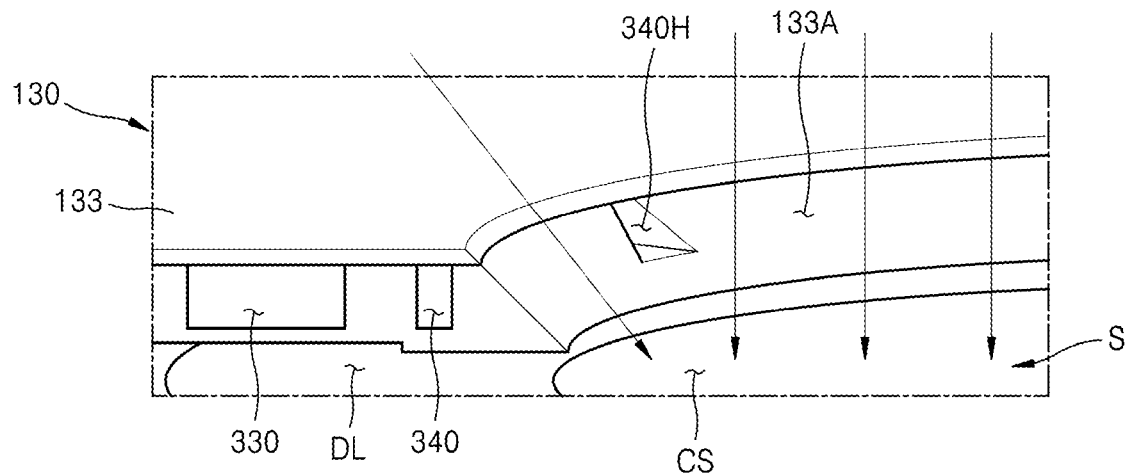
FIG. 7 is an enlarged view of a portion of a mask, according to an example embodiment.

FIG. 7 is an enlarged view of a portion of the mask 130 according to an example embodiment.

Referring to FIG. 7, an inner side surface 133A of the mask 130 according to an example may be inclined downwardly toward the central portion of the opening 135H. In an implementation, the inner side surface 133A of the mask plate 133 may have an inclined surface that is inclined downwardly to the central portion of the opening 135H (e.g., a diameter of the opening 135H distal to the subject S may be greater than a diameter of the opening 135H proximate to the subject S).

The inner side surface 133A of the mask plate 133, which may be inclined, may guide the light, which is irradiated from the light irradiator 120, to the opening 135H. In an implementation, the inner side surface 133A of the mask plate 133, which may be inclined, may guide, to the opening 135H, light that is perpendicular to the upper surface of the mask plate 133 and is inclined towards the upper surface of the mask plate 133.

The mask 130 according to an example embodiment may have the inner side surface 133A that is inclined downwards to the central portion of the opening 135H, and the substrate debonding apparatus 10 including the mask 130 may increase a density of the light irradiated onto the adhesive layer AL of the subject S. Accordingly, the substrate debonding apparatus 10 may improve the speed of operation of separating the support substrate CS from the device substrate DS.

Figure 8:
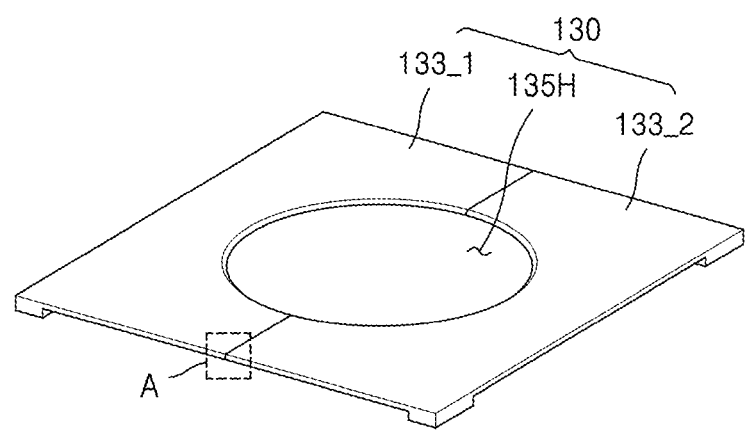
FIG. 8 is a perspective view of a mask according to an example embodiment.
Figure 9:
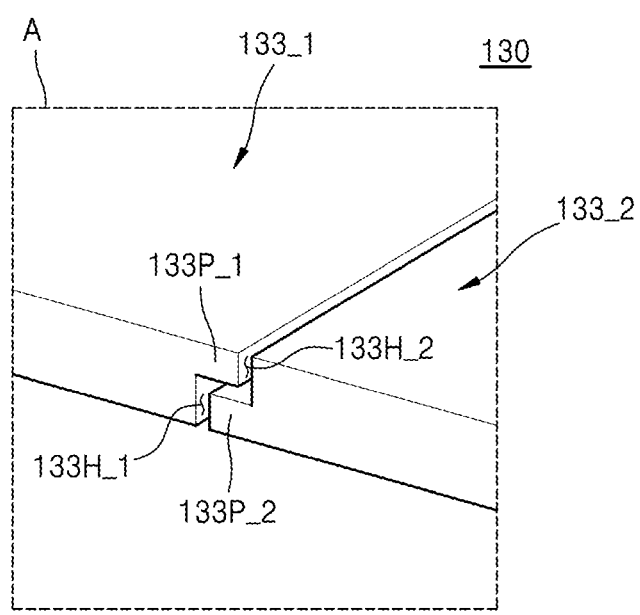
FIG. 9 is a diagram of an enlarged region 'A' of FIG. 8.

FIG. 8 is a perspective view of the mask 130 according to an example embodiment, and FIG. 9 is a diagram of an enlarged region 'A' of FIG. 8

Referring to FIGS. 8 and 9, the mask 130 according to an example embodiment may include mask plates, e.g., first and second mask plates 133_1 and 133_2. In an implementation, the mask 130 may include the first mask plate 133_1 and the second mask plate 133_2 that is separated from the first mask plate 133_1 in the horizontal direction H (e.g., the mask 130 may have a two-piece structure).

In an implementation, the first mask plate 133_1 may include a first protrusion 133P_1 and a first protrusion housing groove 133H_1. In an implementation, the first mask plate 133_1 may include the first protrusion 133P_1 protruding towards the second mask plate 133_2 and the first protrusion housing groove 133H_1 that is adjacent to or under the first protrusion 133P_1.

In an implementation, the second mask plate 133_2 may include a second protrusion 133P_2 and a second protrusion housing groove 133H_2. In an implementation, the second mask plate 133_2 may include the second protrusion 133P_2, which protrudes towards the first protrusion housing groove 133H_1 of the first mask plate 133_1, and the second protrusion housing groove 133H_2, which is adjacent to or in an upper portion of the second protrusion 133P_2 and in which the first protrusion 133P_1 of the first mask plate 133_1 is housed. In an implementation, the first protrusion 133P_1 and the first protrusion housing groove 133H_1 may have a complementary structure to the second protrusion 133P_2 and the second protrusion housing groove 133H_2 such that the first mask plate 133_1 may be coupled with the second mask plate 133_2 in an interengaging relationship.

When the mask 130 according to an example embodiment is viewed in plan view, a gap between the first mask plate 133_1 and the second mask plate 133_2 may overlap at least any one of the first protrusion 133P_1 and the second protrusion 133P_2 in the vertical direction V. In an implementation, when the mask 130 and the subject S according to an example embodiment are viewed in plan view, the subject S may not be viewable through the gap between the first mask plate 133_1 and the second mask plate 133_2.

In an implementation, the mask 130 may include the first and second mask plates 133_1 and 133_2 that are separated or separable from each other, and deformation (e.g., being caused because of the heat energy of the light irradiated from the light irradiator 120) of the mask plate 133 may be reduced.

In an implementation, the mask 130 may include the first and second mask plates 133_1 and 133_2, and if one of the first and second mask plates 133_1 and 133_2 were to be damaged, the one damaged mask plate may be easily replaced with a new mask plate.

In an implementation, the first and second mask plates 133_1 and 133_2 of the mask 130, which may be separated from each other, may include the first cooling passage 330 and the second cooling passage 340, respectively, and the first and second mask plates 133_1 and 133_2 may be quickly cooled.

In an implementation, the gap between the first mask plate 133_1 and the second mask plate 133_2 may overlap one of the first protrusion 133P_1 and the second protrusion 133P_2 in the vertical direction V, and the light irradiated from the light irradiator 120 may not pass through the gap between the first mask plate 133_1 and the second mask plate 133_2.

Due to the above structure of the mask 130, the light irradiated from the light irradiator 120 may not reach the dicing layer DL under the first and second mask plates 133_1 and 133_2. Accordingly, the dicing layer DL may not be damaged by the heat energy of the light irradiated from the light irradiator 120.

Figure 10:
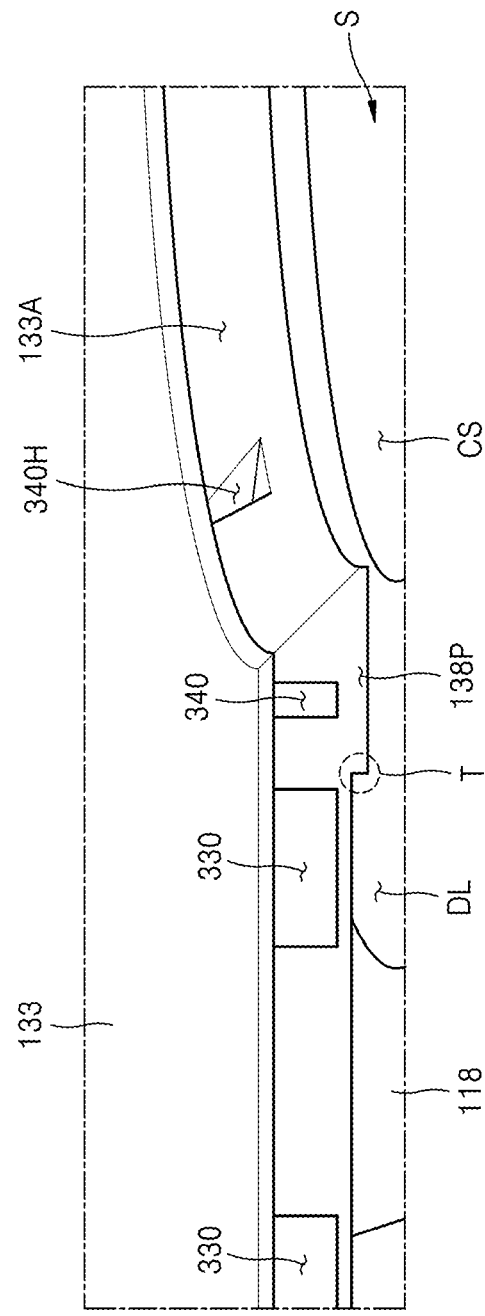
FIG. 10 is an enlarged view of a portion of a substrate debonding apparatus, according to an example embodiment.

FIG. 10 is an enlarged view of a portion of the substrate debonding apparatus 10, according to an example embodiment, As described above, the subject S may be mounted on the substrate chuck 110. Also, when the substrate chuck 110, on which the subject S is mounted, is viewed on a plan view, the support substrate CS and the dicing layer DL of the subject S may be exposed to the outside.

In an implementation, to help prevent damage to the dicing layer DL caused by the heat energy of the light irradiated from the light irradiator 120, the mask 130 may be on the substrate chuck 110 to overlap the exposed dicing layer DL in the vertical direction V. In an implementation, the mask 130 may expose the support substrate CS, and may cover the dicing layer DL.

Referring to FIG. 10, the mask 130 according to an example embodiment may include a light shield protrusion 138P that protrudes downwardly from the lower surface of the mask 130 (e.g., toward the subject S) and overlaps the exposed surface of the dicing layer DL in the vertical direction V.

In an implementation, the light shield protrusion 138P may be on the lower surface of the mask 130, and the mask 130 may have a step difference T at the bottom. In an implementation, the step difference T may be on a portion of the lower surface of the mask 130 that overlaps the exposed surface of the dicing layer DL in the vertical direction.

The mask 130 according to an example embodiment may include the light shield protrusion 138P protruding towards the exposed surface of the dicing layer DL, and an amount of light reaching the exposed surface of the dicing layer DL may decrease. Accordingly, damage (e.g., due to the heat energy of the light irradiated from the light irradiator 120) to the dicing layer DL may be prevented.

Figure 11:
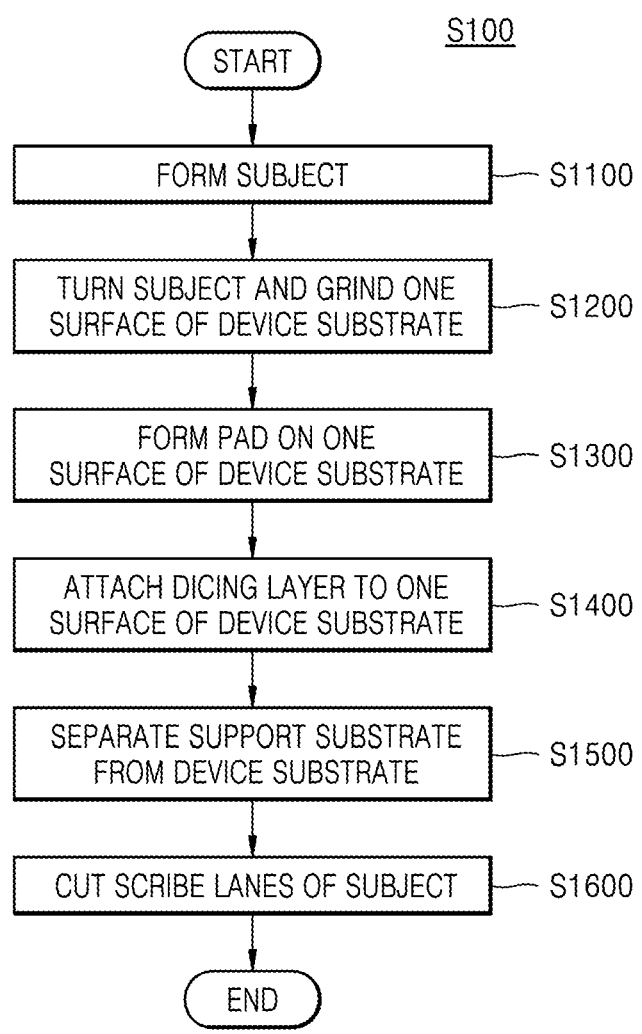
FIG. 11 is a flowchart of operations of a substrate individualization method using a substrate debonding apparatus, according to an example embodiment.

FIG. 11 is a flowchart of operations of a substrate individualization method S100 by using the substrate debonding apparatus 10, according to an example embodiment. In an implementation, the substrate individualization method S100 may include individualizing the subject S after the support substrate CS is separated from the device substrate DS by using the substrate debonding apparatus 10.

FIGS. 12 to 19 illustrate stages in the substrate individualization method S100 by using the substrate debonding apparatus 10, according to an example embodiment.

Figure 12:
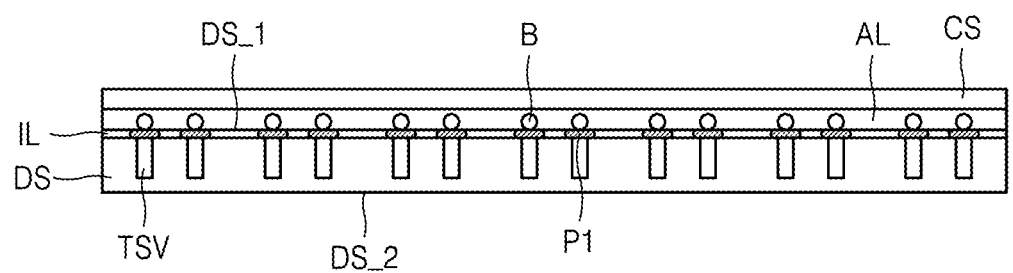
FIGS. 12 to 19 illustrate stages in a substrate individualization method using a substrate debonding apparatus, according to an example embodiment.

Referring to FIGS. 11 and 12, the substrate individualization method S100 according to an example embodiment may include operation S1100 of forming the subject S. The subject S may include the device substrate DS, the adhesive layer AL, the support substrate CS, the through electrode TSV, the bump B, and the like.

In an implementation, the through electrode TSV of the subject S may penetrate a portion of the device substrate DS in the vertical direction V and may be electrically connected to the semiconductor device layer of the device substrate DS. One surface of the through electrode TSV may be exposed to or at the first surface DS_1 of the device substrate DS, and the through electrode TSV may not be exposed to or at the second surface DS_2 of the device substrate DS.

In an implementation, the bump B may be on the first pad P1, and the outer surfaces of the bump B may be surrounded by the adhesive layer AL. The first pad P1 may be on the first surface DS_1 of the device substrate DS and may contact the through electrode TSV. Side surfaces of the first pad P1 may be surrounded by the insulating layer IL. In an implementation, a thickness of the adhesive layer AL may be greater than that of the bump B, and the adhesive layer AL may adhere to the first surface DS_1 of the device substrate DS.

In an implementation, a thickness of the device substrate DS may be less than or equal to about 50 μm. Accordingly, to easily handle the device substrate DS and reduce physical damage thereto, the support substrate CS may adhere to the first surface DS_1 of the device substrate DS by the adhesive layer AL.

Figure 13:
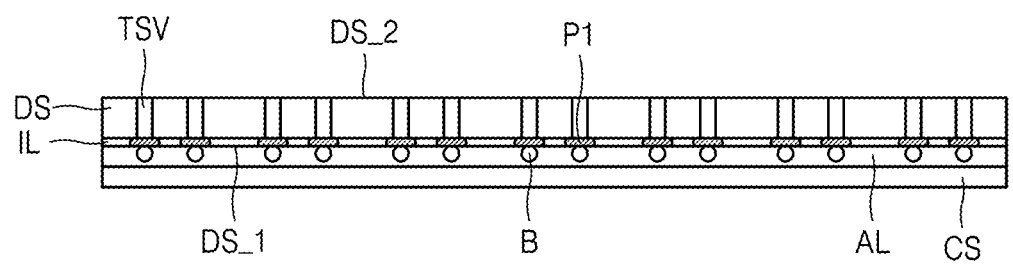

Referring to FIGS. 11 and 13, the substrate individualization method S100 according to an example embodiment may include operation S1200 of turning the subject S and grinding a surface of the device substrate DS.

In an implementation, the turning of the subject S may include moving the subject S to enable the support substrate CS to be under the device substrate DS and the second surface DS_2 of the device substrate DS to face upwards.

In an implementation, grinding the surface of the device substrate DS may include exposing a surface of the through electrode TSV through or at the second surface DS_2 of the device substrate DS by grinding the second surface DS_2 of the device substrate DS.

Figure 14:
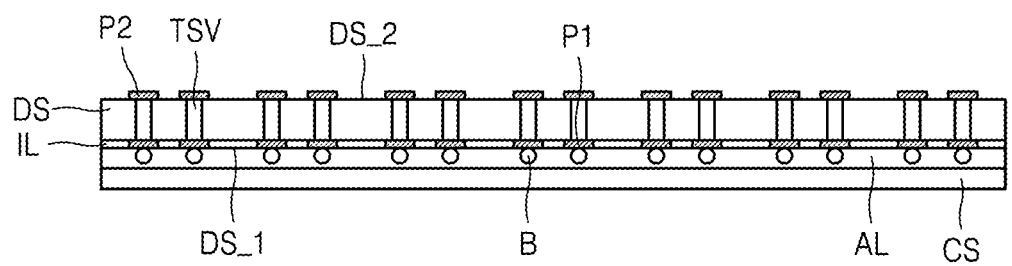

Referring to FIGS. 11 and 14, the substrate individualization method S100 according to an example embodiment may include operation S1300 of forming a pad on a surface of the device substrate DS.

In an implementation, forming the pad may include forming the second pad P2 on the surface of the through electrode TSV exposed through or at the second surface DS_2 of the device substrate DS. The second pad P2 may be formed through a general photolithography process, a plating process, and the like.

Figure 15:
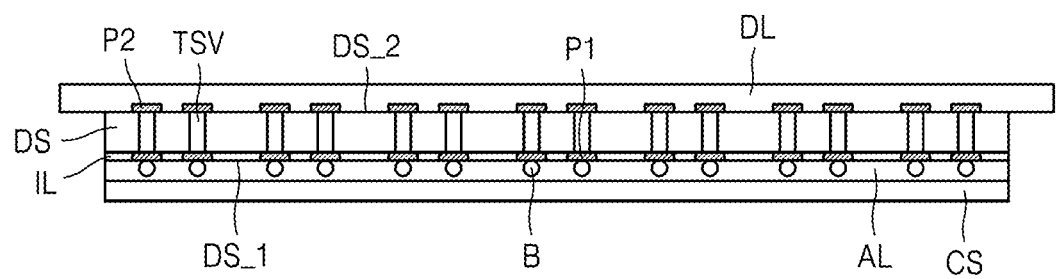

Referring to FIGS. 11 and 15, the substrate individualization method S100 according to an example embodiment may include operation S1400 of attaching the dicing layer DL to one surface of the device substrate DS.

In an implementation, the attaching of the dicing layer DL to the surface of the device substrate DS may include attaching the dicing layer DL to the second surface DS_2 of the device substrate DS. An area of a surface, which is attached to the device substrate DS among surfaces of the dicing layer DL, may be greater than an area of the second surface DS_2 of the device substrate DS. Accordingly, part of the dicing layer DL may be exposed through the side surfaces of the device substrate DS.

In an implementation, the dicing layer DL may have a thickness greater than that of the second pad P2 and may be attached to the second surface DS_2 of the device substrate DS. Accordingly, the second pad P2 may be surrounded by the dicing layer DL.

Figure 16:
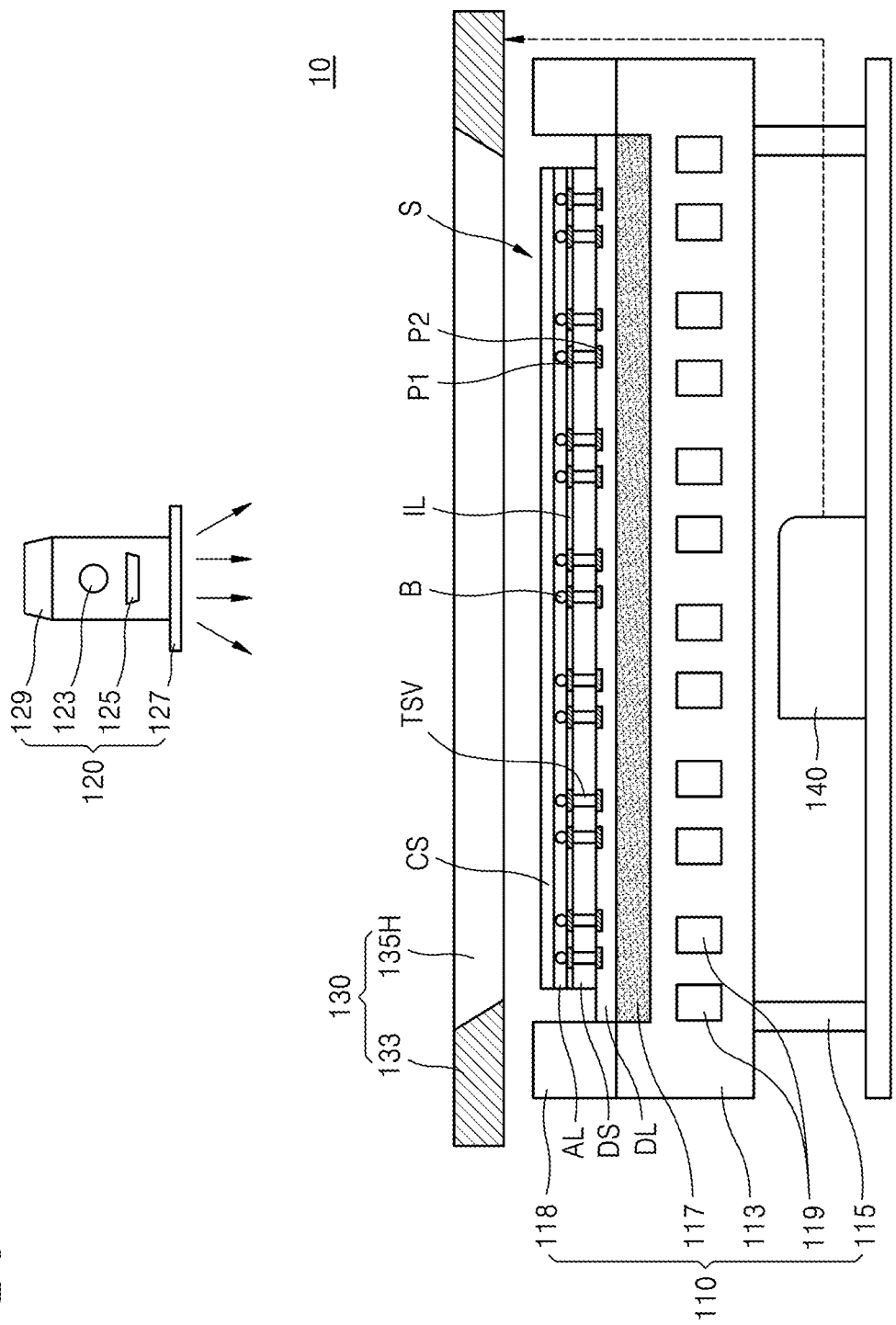
Figure 17:
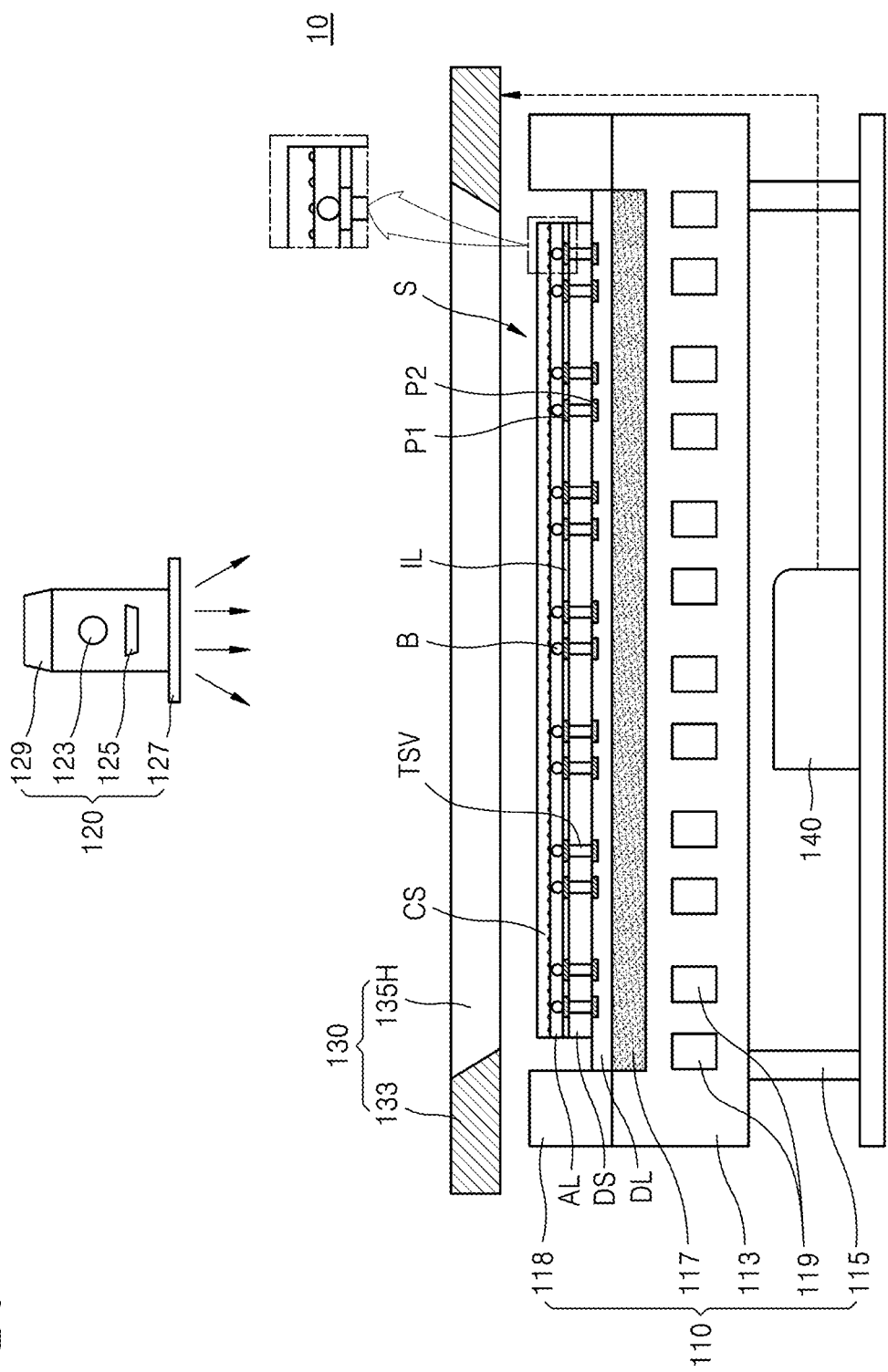

Referring to FIGS. 11, 16, and 17, the substrate individualization method S100 according to an example embodiment may include operation S1500 of separating the support substrate CS from the device substrate DS. Hereinafter, operation S1500 of separating the support substrate CS from the device substrate DS may be referred to as a substrate debonding operation.

In an implementation, separating the support substrate CS from the device substrate DS may include mounting the subject S on the substrate chuck 110 described above, arranging the mask 130, irradiating light onto the adhesive layer AL by using the light irradiator 120, and the like.

The mounting of the subject S on the substrate chuck 110 may include mounting the dicing layer DL of the subject S on the chuck plate 117 of the substrate chuck 110.

In an implementation, the chuck plate 117 may have the porous structure including pores. In an implementation, the chuck plate 117 may include porous ceramic including pores. The chuck plate 117 may have the porous structure, and the chuck plate 117 may provide the suction force evenly on the lower surface of the subject S. Accordingly, physical damage to the subject S on the chuck plate 117 may be prevented.

The arranging of the mask 130 may include arranging the mask 130 and the substrate chuck 110 by moving the mask 130 on the substrate chuck 110 in the horizontal direction H or the vertical direction V.

In an implementation, the controller 220 may control the mask driver 140 to move the mask 130 in the horizontal direction H and the vertical direction V, and thus, the mask 130 and the substrate chuck 110 are arranged.

In an implementation, the controller 220 may control the mask driver 140 to move the mask 130 to enable the mask plate 133 of the mask 130 to overlap the dicing layer DL, which is exposed through or at the side surface of the device substrate DS, in the vertical direction V and the opening 135H of the mask 130 to overlap the upper surface of the support substrate CS in the vertical direction V.

Accordingly, the light, which is irradiated from the light irradiator 120, may not scatter to the periphery of the support substrate CS and may be intensely irradiated onto the adhesive layer AL by passing through the support substrate CS. In an implementation, the mask 130 may overlap the dicing layer DL in the vertical direction, and damage to the dicing layer DL due to the heat energy of the light, which is irradiated from the light irradiator 120, may be prevented.

The irradiating of the light onto the adhesive layer AL may include irradiating light (e.g., ultraviolet rays), which is irradiated from the light irradiator 120, onto the adhesive layer AL. The adhesive layer AL may include a material scattered by or reactive to ultraviolet rays.

When ultraviolet rays are irradiated onto the adhesive layer AL, expandable protrusions may be generated inside the adhesive layer AL and may apply external power or pressure to the support substrate CS in a direction further from the device substrate DS. Accordingly, the device substrate DS may be separated from the support substrate CS.

In the irradiating of the light onto the adhesive layer AL, the temperature sensors 210 may measure the temperature of the mask 130 in real time and transmit the measured temperature to the controller 220. In an implementation, in the irradiating of the light onto the adhesive layer AL, the temperature sensors 210 may measure the temperature of the mask 130 according to the contact with the mask 130.

In an implementation, when the controller 220 determines that the temperature of the mask 130 is greater than the reference temperature, the controller 220 may stop all operations of the substrate debonding apparatus 10. In an implementation, the controller 220 may adjust a temperature, a discharge, a speed, and the like of the coolant flowing in the mask 130.

In an implementation, in the irradiating of the light onto the adhesive layer AL, the coolant may flow in the first cooling passage 330 of the mask 130. The coolant in the first cooling passage 330 may cool the mask 130 during the irradiating of the light onto the adhesive layer AL. Accordingly, the deformation of and damage to the mask 130 due to the heat energy of the light may be prevented.

In an implementation, in the irradiating of the light onto the adhesive layer AL, air may flow in the second cooling passage 340 of the mask 130. In an implementation, part of the air in the second cooling passage 340 may be provided to the central portion of the opening 135H through the air exhaust hole 340H. In an implementation, in the irradiating of the light onto the adhesive layer AL, the air provided to the central portion of the opening 135H may cool the subject S. Accordingly, the deformation of and damage to the subject S because of the heat energy of the light may be prevented.

In an implementation, in the irradiating of the light onto the adhesive layer AL, the coolant for cooling the subject S may flow in the chuck cooling passage 119 in the substrate chuck 110. Accordingly, in the irradiating of the light onto the adhesive layer AL, the deformation of and damage to the subject S because of the heat energy of the light may be prevented.

Figure 18:
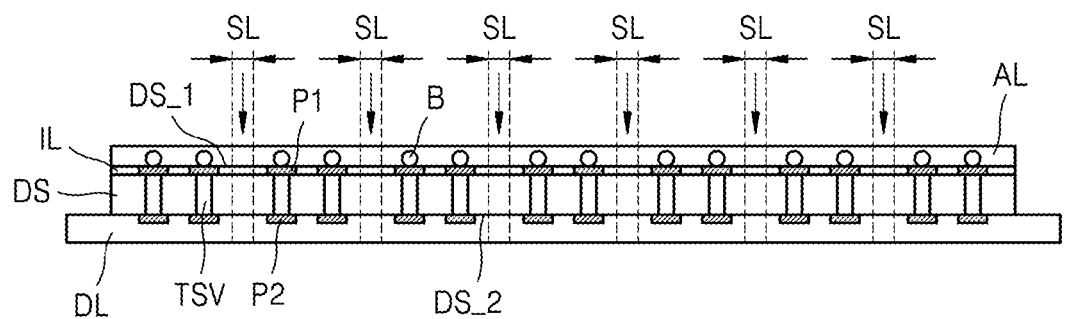
Figure 19:
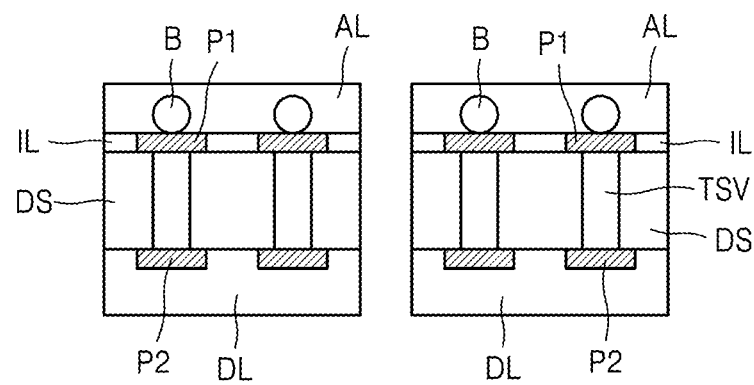

Referring to FIGS. 11, 18, and 19, the substrate individualization method S100 according to an example embodiment may include operation S1600 of cutting scribe lanes SL of the subject S.

In an implementation, cutting scribe lanes SL may include cutting the scribe lanes SL of the subject S by using blade wheels. In an implementation, cutting the scribe lanes SL of the subject S may include cutting the scribe lanes SL of the subject S by using blade wheels including diamond.

In an implementation, cutting the scribe lanes SL of the subject S may include cutting the subject S by using laser. In an implementation, cutting the scribe lanes SL of the subject S may include cutting the subject S by irradiating light, which is emitted from the laser, to the inside of the scribe lanes SL of the subject S.

In an implementation, as the scribe lanes SL of the subject S are cut, adhesion of the dicing layer DL may be maintained. In an implementation, as the scribe lanes SL of the subject S are cut, the dicing layer DL may adhere to the device substrate DS.

After the scribe lanes SL of the subject S are cut, individualizing the subject S may be performed by extending the dicing layer DL in the horizontal direction H. When the dicing layer DL extends in the horizontal direction H (e.g., a direction parallel to a direction in which the device substrate DS extends), the subject S may be individualized into multiple subjects S.

In an implementation, the individualized subjects S may adhere to the dicing layer DL. To separate the dicing layer DL from the device substrate DS, light (e.g., ultraviolet rays) may be irradiated onto the inside of the dicing layer DL. Accordingly, the adhesion between the dicing layer DL and the device substrate DS may decrease, and the dicing layer DL may be separated from the device substrate DS.

In an implementation, the adhesive layer AL of the individualized subject S may be physically removed through a separate member such as an adhesive tape, an adhesive roller, or the like which have great adhesion to the adhesive layer AL.

By way of summation and review, when an intensity of the irradiated light is relatively great, the support substrate and the device substrate may be easily separated from each other, and the device substrate may be damaged due to heat energy of the light.

One or more embodiments may provide a substrate debonding apparatus that separates a support substrate from a device substrate.

One or more embodiments may provide a substrate debonding apparatus that decreases the possibility of damage to a device substrate and a dicing layer due to heat energy of light and separates a support substrate from the device substrate.

One or more embodiments may provide a substrate debonding apparatus that quickly cools a mask and the device substrate while the support substrate is separated from the device substrate.

One or more embodiments may provide a substrate debonding apparatus that improves the speed of separating the support substrate from the device substrate.

The substrate debonding apparatus may include the mask, which overlaps an exposed surface of a dicing layer in a vertical direction, and the mask driver, which is configured to move the mask, the substrate debonding apparatus may decrease damage to the dicing layer and the device substrate because of heat energy of light and separate a support substrate from the device substrate.

The mask and the substrate chuck of the substrate debonding apparatus may include cooling passages therein, the substrate debonding apparatus may quickly cool the mask and the device substrate while the support substrate is separated from the device substrate.

The mask and the substrate chuck of the substrate debonding apparatus may include cooling passages therein, the substrate debonding apparatus may improve the speed of separating the support substrate from the device substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate debonding apparatus configured to separate a support substrate attached to a first surface of a device substrate by an adhesive layer, the substrate debonding apparatus comprising:
    a substrate chuck configured to support a second surface of the device substrate, the second surface being opposite to the first surface of the device substrate;
    a light irradiator configured to irradiate light to an inside of the adhesive layer; and
    a mask between the substrate chuck and the light irradiator, the mask including:
        an opening through which an upper portion of the support substrate is exposed, and
        a first cooling passage or a second cooling passage, the first cooling passage being configured to provide a path in which a coolant is flowable, the second cooling passage being configured to provide a path in which air is flowable and to provide part of the air to a center of the opening.

2. The substrate debonding apparatus as claimed in claim 1, wherein an inner side surface of the mask is inclined downwardly to a center of the opening.

3. The substrate debonding apparatus as claimed in claim 1, wherein the mask includes:
    a first mask plate; and
    a second mask plate separated from the first mask plate.

4. The substrate debonding apparatus as claimed in claim 3, wherein:
    the first mask plate includes:
        a first protrusion protruding towards the second mask plate, and
        a first protrusion housing groove,
    the second mask plate includes:
        a second protrusion protruding towards the first protrusion housing groove of the first mask plate, and
        a second protrusion housing groove accommodating the first protrusion, and
    when the mask is viewed on a plan view, a gap between the first mask plate and the second mask plate overlaps one of the first protrusion and the second protrusion in a vertical direction.

5. The substrate debonding apparatus as claimed in claim 1, wherein:
    the substrate chuck is configured to support a dicing layer attached to the second surface of the device substrate, the dicing layer having an area greater than an area of the second surface of the device substrate, and
    the mask includes a light shield protrusion protruding downwardly from a lower portion of the mask to overlap, in a vertical direction, a surface of the dicing layer that is exposed at side surfaces of the device substrate.

6. The substrate debonding apparatus as claimed in claim 1, further comprising a mask driver configured to move the mask in a horizontal direction or a vertical direction.

7. The substrate debonding apparatus as claimed in claim 6, further comprising:
    a temperature sensor coupled to the substrate chuck and configured to measure a temperature of the mask through contact with the mask; and
    a controller connected to the mask driver and the temperature sensor,
    wherein the controller is configured to:
    control the mask driver to align the mask with the substrate chuck in the horizontal direction, and
    control the mask driver to make the mask contact the temperature sensor by moving the mask in the vertical direction.

8. A substrate debonding apparatus configured to separate a support substrate attached to a first surface of a device substrate by an adhesive layer, the substrate debonding apparatus comprising:
    a substrate chuck configured to support a second surface of the device substrate, the second surface being opposite to the first surface of the device substrate;
    a light irradiator configured to irradiate light to an inside of the adhesive layer;
    a mask between the substrate chuck and the light irradiator and including an opening through which an upper portion of the support substrate is exposed; and
    a mask driver configured to move the mask in a horizontal direction or a vertical direction.

9. The substrate debonding apparatus as claimed in claim 8, wherein the mask includes an alloy of iron and nickel.

10. The substrate debonding apparatus as claimed in claim 8, further comprising:
    a temperature sensor attached to the substrate chuck and configured to measure a temperature of the mask by contacting the mask; and
    a controller connected to the mask driver and the temperature sensor,
    wherein the controller is configured to:
    control the mask driver to align the mask with the substrate chuck in the horizontal direction, and
    control the mask driver to enable the mask to contact the temperature sensor by moving the mask in the vertical direction.

11. The substrate debonding apparatus as claimed in claim 8, wherein:
    the substrate chuck includes:
        a chuck table;
        a chuck plate on the chuck table, the chuck plate having a porous structure to provide a suction force to a lower portion of the device substrate; and
        a chuck frame configured to support the chuck table,
    the mask driver is under the chuck table, and
    the mask is connected to the mask driver by a connector that extends downwardly from the mask and surrounds side and lower surfaces of the chuck table.

12. The substrate debonding apparatus as claimed in claim 8, wherein the mask includes a first cooling passage configured to provide a path in which a coolant is flowable.

13. The substrate debonding apparatus as claimed in claim 8, wherein the mask includes a second cooling passage configured to provide a path, in which air is flowable, and to provide a part of the air to a central portion of the opening.

14. The substrate debonding apparatus as claimed in claim 8, wherein an inner side surface of the mask is inclined downwardly to a center of the opening.

15. The substrate debonding apparatus as claimed in claim 8, wherein:
    the mask includes:
        a first mask plate including a first protrusion and a first protrusion housing groove; and a second mask plate separated from the first mask plate and including a second protrusion, which protrudes towards the first protrusion housing groove, and a second protrusion housing groove accommodating the first protrusion, and when the mask is viewed on a plan view, a gap between the first mask plate and the second mask plate overlaps one of the first protrusion and the second protrusion in the vertical direction.

16. A substrate debonding apparatus configured to separate a support substrate attached to a first surface of a device substrate by an adhesive layer, the substrate debonding apparatus comprising:

a substrate chuck configured to support the device substrate and including a chuck cooling passage in which first coolant for cooling the device substrate is flowable;

a light irradiator configured to irradiate light to and inside of the adhesive layer; and a mask between the substrate chuck and the light irradiator and including:

an opening through which an upper portion of the support substrate is exposed, and a first cooling passage or a second cooling passage, the first cooling passage being configured to provide a path in which a second coolant is flowable, and the second cooling passage being configured to provide a path in which air is flowable and to provide part of the air to a central portion of the opening.

17. The substrate debonding apparatus as claimed in claim 16, wherein the substrate chuck includes a chuck plate having a porous structure to provide a suction force to a lower portion of the device substrate.

18. The substrate debonding apparatus as claimed in claim 16, further comprising:

a mask driver configured to move the mask a horizontal direction or a vertical direction;

a temperature sensor attached to the substrate chuck and configured to measure a temperature of the mask by contacting the mask; and a controller connected to the mask driver and the temperature sensor, wherein the controller is configured to:

control the mask driver to align the mask with the substrate chuck in the horizontal direction, and control the mask driver to enable the mask to contact the temperature sensor by moving the mask in the vertical direction.

19. The substrate debonding apparatus as claimed in claim 16, wherein:

the mask includes:

a first mask plate including a first protrusion and a first protrusion housing groove; and a second mask plate separated from the first mask plate and including a second protrusion, which protrudes towards the first protrusion housing groove, and a second protrusion housing groove accommodating the first protrusion, and when the mask is viewed on a plan view, a gap between the first mask plate and the second mask plate overlaps one of the first protrusion and the second protrusion in the vertical direction.

20. The substrate debonding apparatus as claimed in claim 16, wherein:

the substrate chuck is attached to a second surface of the device substrate that is opposite to the first surface of the device substrate, and is configured to support a dicing layer, the dicing layer having an area greater than an area of the second surface, and the mask includes a light shield protrusion protruding downwardly from a lower portion of the mask to overlap a surface of the dicing layer, which is exposed at a side surface of the device substrate, in the vertical direction.

* * * * *